United States Patent [19]
Knirck et al.

[11] Patent Number: 5,883,703
[45] Date of Patent: Mar. 16, 1999

[54] METHODS AND APPARATUS FOR DETECTING AND COMPENSATING FOR FOCUS ERRORS IN A PHOTOLITHOGRAPHY TOOL

[75] Inventors: Jeffrey G. Knirck; John A. Gibson, both of Sunnyvale; Paul A. Swanson, San Jose, all of Calif.

[73] Assignee: Megapanel Corporation, Las Vegas, Nev.

[21] Appl. No.: 600,592

[22] Filed: Feb. 8, 1996

[51] Int. Cl.⁶ .......................... G03B 27/52; G03B 27/68; G03B 27/42; G03B 27/54
[52] U.S. Cl. .................. 355/55; 355/52; 355/53; 355/67
[58] Field of Search ................ 355/52, 53, 55, 355/71, 75

[56] References Cited

U.S. PATENT DOCUMENTS

| | | | |
|---|---|---|---|
| 3,748,015 | 7/1973 | Offner | 350/55 |
| 3,819,265 | 6/1974 | Feldman et al. | 355/51 |
| 3,936,184 | 2/1976 | Tanaka et al. | 355/30 |
| 4,103,989 | 8/1978 | Rosin | 350/199 |
| 4,171,870 | 10/1979 | Bruning et al. | 350/173 |
| 4,171,871 | 10/1979 | Dill et al. | 350/199 |
| 4,293,186 | 10/1981 | Offner | 350/27 |
| 4,302,079 | 11/1981 | White | 350/371 |
| 4,391,494 | 7/1983 | Hershel | 350/442 |
| 4,425,037 | 1/1984 | Hershel et al. | 355/43 |
| 4,598,242 | 7/1986 | Hayashi et al. | 318/640 |
| 4,655,584 | 4/1987 | Tanaka et al. | 355/53 |
| 4,708,466 | 11/1987 | Isohata et al. | 355/53 |
| 4,719,705 | 1/1988 | Laganza et al. | 33/568 |
| 4,748,477 | 5/1988 | Isohata et al. | 355/53 |
| 4,757,355 | 7/1988 | Iizuka et al. | 355/53 |
| 4,758,864 | 7/1988 | Endo et al. | 355/53 |
| 4,769,680 | 9/1988 | Resor, III et al. | 355/43 |
| 4,864,360 | 9/1989 | Isohata et al. | 355/53 |
| 4,894,303 | 1/1990 | Wu | 430/13 |
| 4,924,257 | 5/1990 | Jain | 355/53 |
| 4,958,160 | 9/1990 | Ito et al. | 355/53 |
| 5,031,977 | 7/1991 | Gibson | 350/1.4 |
| 5,117,254 | 5/1992 | Kawashima et al. | 355/53 |
| 5,130,747 | 7/1992 | Kikuiri et al. | 355/53 |
| 5,160,957 | 11/1992 | Ina et al. | 355/53 |
| 5,160,961 | 11/1992 | Marumo et al. | 355/53 |
| 5,187,519 | 2/1993 | Takabayashi et al. | 355/53 |
| 5,204,711 | 4/1993 | Tabuko et al. | 355/53 |
| 5,281,996 | 1/1994 | Bruning et al. | 355/77 |
| 5,285,236 | 2/1994 | Jain | 355/53 |
| 5,291,240 | 3/1994 | Jain | 355/53 |
| 5,448,336 | 9/1995 | Shiraishi | 355/71 |
| 5,489,966 | 2/1996 | Kawashima et al. | 355/43 |
| 5,502,313 | 3/1996 | Nakamura et al. | 250/559.26 |
| 5,657,130 | 8/1997 | Shirasu et al. | 356/401 |
| 5,677,090 | 10/1997 | Marumoto et al. | 430/5 |

FOREIGN PATENT DOCUMENTS 1095078  12/1967  United Kingdom .

OTHER PUBLICATIONS

Telefax Message dated Jun. 15, 1990 from Dr. R. Wijnaendts to Mr. Bill Tobey ACT; Telefax Message dated Jun. 13, 1990 from Dr. Wijnaendts to Mr. A.C. Tobey; Patent Specification, including 4 sheets of drawing, for application entitled, "Process for Producing or Inspecting Micropatterns on Large–area Substrates".

*Primary Examiner*—Richard Moses
*Assistant Examiner*—Shival Virmani
*Attorney, Agent, or Firm*—Townsend and Townsend and Crew LLP

[57] ABSTRACT

An apparatus for detecting and compensating for focus errors in a photolithography tool which holds a reticle and a substrate substantially parallel is described. The apparatus includes at least one proximity gauge for determining a first distance between the reticle and the substrate, thereby determining if a focus error condition exists. The apparatus also includes an actuator for adjusting the position of the reticle with respect to the substrate, thereby compensating for the focus error condition. According to another embodiment, a lens system actuator is employed for adjusting a lens system parameter, thereby compensating for the focus error condition detected by the at least one proximity gauge.

40 Claims, 8 Drawing Sheets

METHODS AND APPARATUS FOR DETECTING AND COMPENSATING FOR FOCUS ERRORS IN A PHOTOLITHOGRAPHY TOOL

BACKGROUND OF THE INVENTION

The present invention relates to the field of photolithographic techniques. More specifically, the invention relates to the detection of and compensation for focal plane location and planarity errors. Still more specifically, one embodiment of the present invention provides an improved method and apparatus for measuring the distance between the focal planes of the reticle and the substrate in a photolithography system which employs scanning or stepping of both the reticle and the substrate. Another embodiment of the present invention provides an improved method and apparatus for adjusting the focus of Wynn-Dyson or other unity magnification, telecentric, catadioptic lens system. Another embodiment of the present invention provides an improved method and apparatus for eliminating or modifying the sag or warp in a reticle or substrate in a photolithography system. The present invention will be particularly useful in photolithography systems that are used for printing on large substrates, printing from large reticles, or where the depth of focus is so small that even slight focus errors are important.

Currently there are a number of problems associated with holding reticles and substrates in high resolution photolithography systems so that they are flat and parallel to the degree required to maintain good focus. These problems are particularly pronounced in photolithography systems which rapidly process large area substrates using very large imaging fields as in the case of, for example, the manufacture of flat panel displays and multi-chip modules. Also problematic in this regard is the processing of devices such as microprocessor chips and dynamics memory (DRAM) chips which employs relatively large fields and lenses which have very shallow depth of focus.

One focus problem encountered with photolithography systems which move both the reticle and the substrate relative to the lens is the creation and maintenance of the proper gaps and parallelism between the reticle, substrate, and lens. Focus gauging and adjustment techniques exist for the more traditional lithography tools that have fixed lenses and reticles, but more and different techniques are needed for systems which move both the reticle and the substrate and for the new multiple axis scanners. Traditionally, the reticle stage (and therefore the reticle) is permanently fixed with respect to the lens, and the position of the substrate relative to the lens is sensed using, for example, reflective laser beams, capacitive techniques, or air gap sensing technology.

Another problem is encountered when adjusting the focus of a photolithography system. The traditional technique is to adjust the position of the substrate relative to the fixed lens and reticle. This is still a valid technique for some applications, but it would be very difficult for a system employing this technique to adequately compensate for realtime focus variations in a high-speed scanning application such as those used to process large area substrates.

Another focus problem involves keeping the reticle and substrate planes parallel. Keeping the substrate flat is relatively easy. It can be rigidly attached over its entire surface to a flat substrate chuck with vacuum. However, the reticle must be supported only on its perimeter to allow a clear aperture over the majority of its area through which light may be projected. This type of support allows any natural warp or stress in the reticle to be expressed as a focal plane error. Mounting the reticle on a reticle chuck with a predominately horizontal attitude exacerbates the problem by inducing sag of the reticle due to gravity. Currently, no satisfactory techniques exist which prevent or compensate for this problem.

From the foregoing, it will be understood that improved techniques for dealing with focus problems are needed, particularly for multiple axis scanning systems, large area substrate processing, and systems employing lenses with shallow depth of focus.

SUMMARY OF THE INVENTION

The present invention provides new and improved methods and apparatus for the detection of and compensation for focal plane location and planarity errors during photolithographic processes.

According to a specific embodiment of the present invention, proximity gauges are attached to the lens system located between the reticle and substrate to measure the distances from the lens system to the reticle and substrate, and to therefrom determine the distance between the reticle and substrate planes. These measurements are then used in various embodiments to facilitate adjustment of the lens focus, the reticle to substrate separation, and the spacing between the lens system and the reticle and/or substrate.

According to another specific embodiment of the present invention, the focus of a unity magnification, telecentric, catadioptic lens system frequently used in photolithography equipment, such as, for example, a Wynn-Dyson lens system, can be manipulated quickly and precisely by adjusting the axial position of the primary mirror with respect to the other lens elements.

According to still another specific embodiment of the invention, a distorted reticle focal plane due to sag or warp is corrected by supporting the portion of the reticle around the lens at a fixed distance from the lens with an air bearing. According to yet another embodiment, a distorted reticle focal plane is corrected by supporting the reticle or a portion of the reticle from the side opposite the lens system by applying air pressure or vacuum as needed in a either a fixed or dynamic spatial pattern.

Thus, according to the invention, a method and apparatus for detecting and compensating for focus errors in a photolithography tool are described. The apparatus includes at least one proximity gauge for determining a first distance between the reticle and the substrate, or alternatively the distances between the reticle and the tool's lens system and the substrate and the lens system, respectively. These distances are used to determine if a focus error condition exists. The apparatus also includes an actuator for adjusting the position of the reticle with respect to the substrate, thereby compensating for the focus error condition. According to another embodiment for use in such a system, a lens system actuator is employed for adjusting a lens system parameter, thereby compensating for the focus error condition.

A lens system is also described which includes a primary mirror, a plurality of lens elements including at least one prism, and a primary mirror actuator for adjusting the axial position of the primary mirror with respect to the plurality of lens elements, thereby moving the image plane.

A reticle is also described which includes a plurality of image fields distributed over its surface. At least one stiffener is secured to the surface of the reticle in a portion of the non-imaging areas between the image fields for reducing warpage of the reticle.

A reticle chuck assembly is also described which includes a reticle chuck frame having an aperture, and a substantially transparent reticle chuck secured to the reticle chuck frame which has a surface for holding a reticle.

A further understanding of the nature and advantages of the inventions may be realized by reference to the remaining portions of the specification and the drawings.

DESCRIPTION OF SPECIFIC EMBODIMENTS

Figure 1:
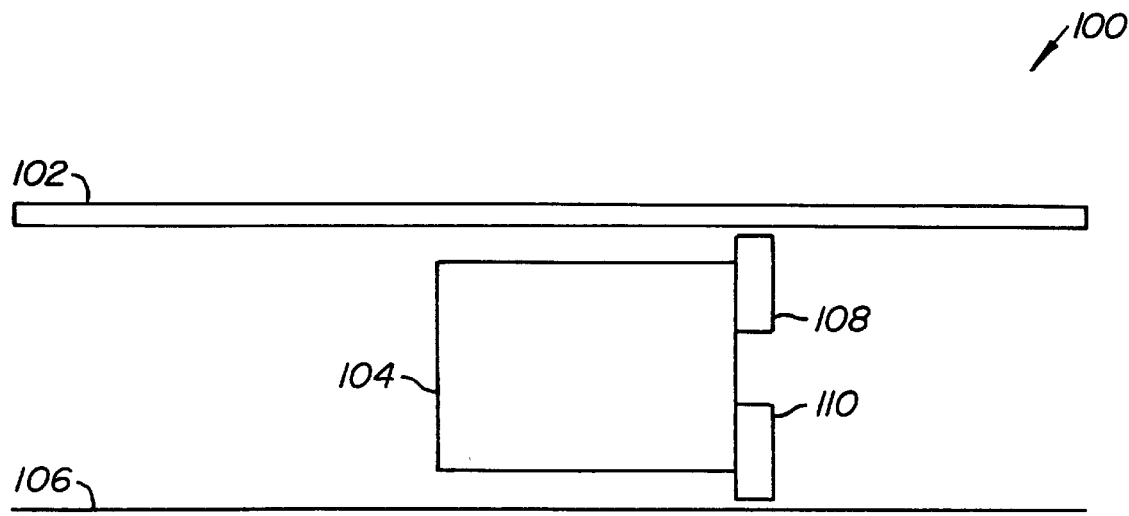
FIG. 1 is a side view block diagram of a photolithography system showing the relationship between the reticle, lens, substrate, and reticle and substrate gauges.

FIG. 1 is a view of a photolithography system 100 with a focus gauging apparatus designed according to a specific embodiment of the present invention. The block diagram shows a side view of system 100 which shows the relationship between reticle 102, lens 104, substrate 106, and a reticle and substrate gauges 108 and 110 which are attached to lens 104. According to various embodiments, reticle 102, substrate 106 and lens 104 are scanned and/or stepped in planes parallel to the surface of the substrate and must remain parallel and properly spaced relative to each other. Reticle gauge 108 measures the separation between reticle 102 and lens 104. Reticle gauge 108 is placed to gauge an area on reticle 102 adjacent to or surrounding the active area of reticle 102 at any given moment. Substrate gauge 110 measures the separation between substrate 106 and the lens 104. Substrate gauge 110 is placed to gauge an area on substrate 110 adjacent to or surrounding the active area of substrate 110 at any given moment. It will be understood that reticle and substrate gauges 108 and 110 may each comprise a plurality of gauges. The information from gauges 108 and 110 is used to adjust the focus of the system either statically or dynamically. The focus adjustment can be accomplished in a variety of different ways including the techniques described herein. For example, the gauges could be strategically mounted on the lens to read the "terrain" ahead of the relative motion of the lens with respect to the reticle and substrate. In addition, gauges mounted on both sides of the lens could read immediately in front of the lens whether it is scanning or stepping forward or backward. Gauges on the right and left sides of the lens could read one row ahead of the lens whether the serpentine stepping pattern turns right or left. By extension, an array of gauges could be mounted to various stationary or moving structures in the system to systematically measure the substrate and/or reticle.

Figure 2:
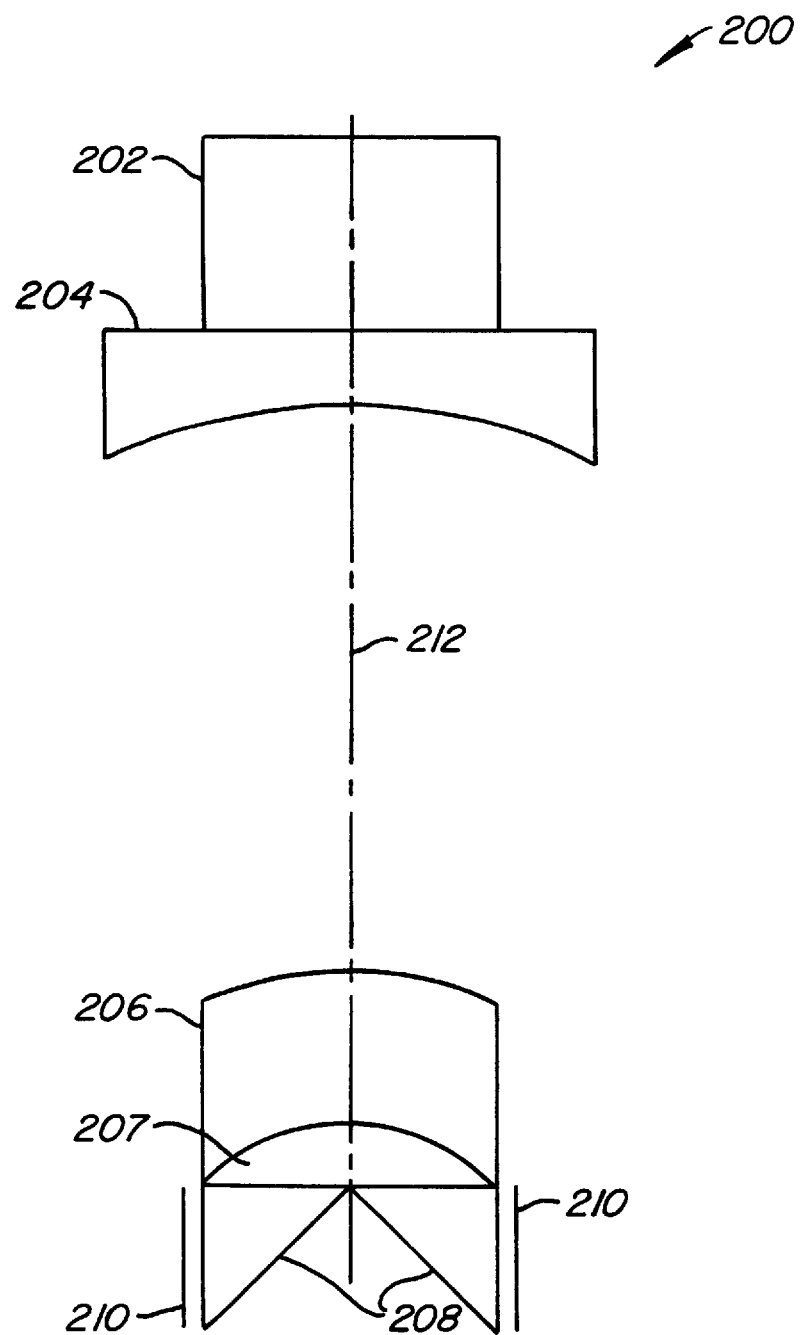
FIG. 2 is a schematic representation of a Wynn-Dyson lens system showing a positioning actuator coupled to the primary mirror.

FIG. 2 is a view of a lens system 200 for use in a photolithography system with a focus adjustment apparatus designed according to a specific embodiment of the present invention. Lens system 200 is shown as a Wynn-Dyson lens system having a positioning actuator 202 attached to primary mirror 204. Lens system 200 includes primary mirror 204, multiple front lenses 206 and 207, and two prisms 208 which provide image planes 210 on opposite sides of lens system 200. In a typical Wynn-Dyson configuration, all lens elements (including primary mirror 204) are held rigidly with respect to each other at precisely fixed locations. All the lens elements must remain collinear on the optical axis or undesirable aberrations will be induced, particularly for multi-chromatic systems. In the embodiment of the invention shown in FIG. 2, positioning actuator 202 is attached to primary mirror 204 to displace it precisely along optical axis 212 and to thereby effect focus shifts in lens system 200. This technique capitalizes on the fact that in such a lens system movement of primary mirror 204 along optical axis 212 primarily affects focus without introducing any other deleterious effects, within a large focus range. Referring to FIG. 2, the effect of moving primary mirror 204 toward the other elements is to shift image planes 210 away from the surfaces of prisms 208. A similar relationship between axial position and image plane position exists for some of the other lens elements such as, for example, prisms 208. Thus, these elements could be used in a similar manner to effect focus shifts. However, primary mirror 204 is generally separated from the other elements and more available for coupling to other devices, such as positioning actuator 202. Lens system 200 may be employed for a technique called "focus drilling" which involves moving the focus during an exposure to increase the effective depth of focus of the lens system. This technique may be performed in a stepper photolithography system, and even for a scanner system by rapidly oscillating the axial position of the primary mirror.

Figure 3:
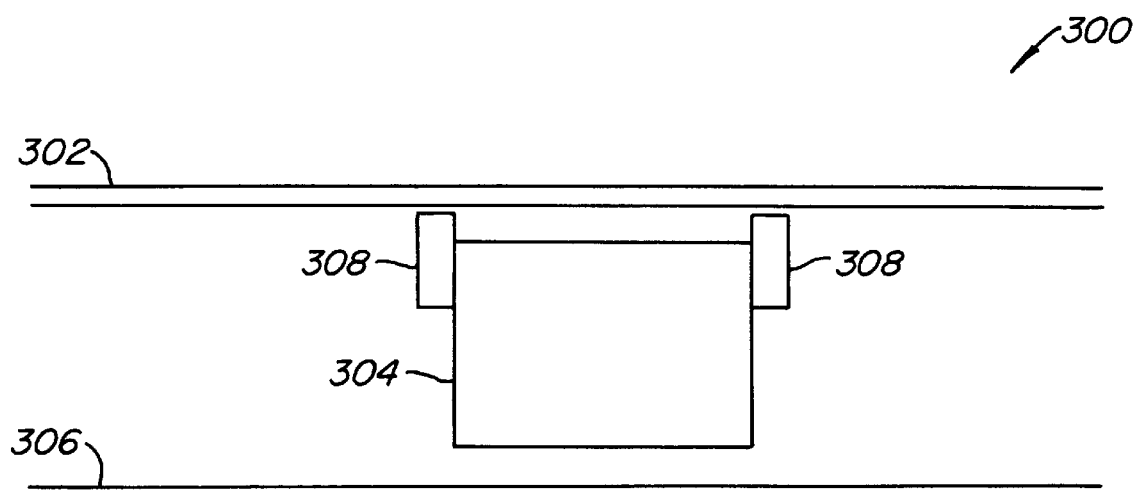
FIG. 3 is a side view block diagram of a photolithography system showing the relationship between the reticle, lens, substrate, and reticle support air bearings.

FIG. 3 shows a photolithography system 300 with a focus adjusting apparatus designed according to a specific embodiment of the present invention. The side view block diagram shows the relationship between reticle 302, lens 304, substrate 306, and reticle support air bearings 308 which are attached to lens 304. Reticle 302, substrate 306 and lens 304 are scanned and/or stepped in planes parallel to the surface of the substrate and must remain parallel and properly spaced relative to each other. Reticle support air bearings 308 exert force on reticle 302 in the direction away from substrate 306, pushing reticle 302 away from lens 304 to provide a precisely controlled separation between reticle 302 and lens 304. This action counteracts the sag of reticle 302 due to gravity as well as any natural warp in reticle 302. One or more reticle support air bearings 308 are strategically placed to apply pressure to an area on reticle 302 adjacent to or surrounding the active area of the reticle at any given moment. The use of air bearings provides precisely controlled application of force without a solid object physically contacting reticle 302. In addition, the force introduced by air bearings 308, and by extension, the position of reticle 302, may be dynamically adjusted by modulation of the air pressure to air bearings 308. According to various embodiments, sag or warp of reticle 302 away from lens 304 and substrate 306 may be counteracted by augmenting air bearings 308 with vacuum ports placed adjacent to or surrounding air bearings 308 to pull localized portions of the surface of reticle 302 toward air bearings 308. Alternatively, the air pressure mechanism depicted in FIG. 4 may be used to push the reticle against the reticle support air bearings. Another alternative is to follow the lens and the reticle support air bearings with another set of softer air bearing on the other side of the reticle to apply force to the opposite side of the reticle which opposes the force applied by the reticle support air bearings. These softer air bearings could be mounted to the illuminator (not shown) which is located on the opposite of the reticle from the lens.

Figure 4:
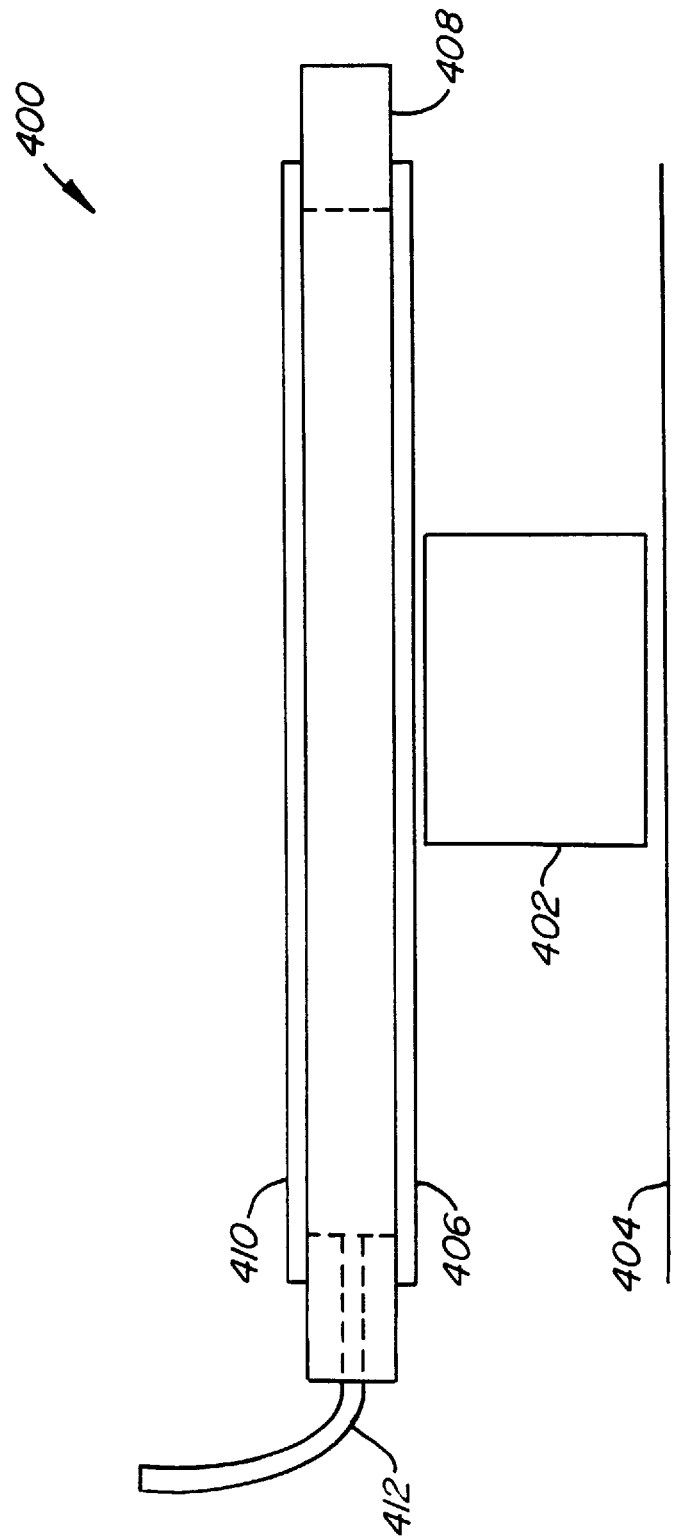
FIG. 4 is a side view block diagram of a photolithography system showing a reticle chuck which forms a sealed chamber.

FIG. 4 shows a photolithography system 400 with a focus adjusting apparatus designed according to another embodiment of the present invention. This side view block diagram shows the relationship between lens 402, substrate 404, and a reticle 406 on a reticle chuck 408 which forms a sealed chamber within its aperture (indicated by the vertical dashed lines) with reticle 406 acting as one wall. Reticle chuck 408 is constructed as a large stiff plate with a reticle chuck aperture (not shown) to allow illumination pass through reticle chuck 408 and through reticle 406 to lens 402 and substrate 404. Reticle chuck 408 is substantially larger than reticle 406 so that reticle chuck 408 can support the entire perimeter of reticle 406. The reticle chuck aperture is substantially smaller than reticle 406 so that reticle chuck 408 can support reticle 406 over a substantial area. Reticle 406 is attached to reticle chuck 408 by vacuum. A multitude of vacuum ports (not shown) are manufactured into the surface of reticle chuck 408 in the area to which reticle 406 is attached. A second large transparent plate 410 similar to a reticle but completely transparent is permanently attached to the surface of reticle chuck 408 opposite reticle 406. This reticle chuck cavity cover 410 must be completely transparent to allow illumination to pass through it. Reticle chuck cavity cover 410 with reticle 406 transforms the reticle chuck aperture into a pressurizable volume. A pressure control port 412 is provided to introduce pressure. The pressure in the volume can be set to counteract sagging of reticle 406 due to gravity. The pressure in the volume can also be dynamically modulated to distort the surface of reticle 406 slightly at any point to counteract localized warpage. The dynamic distortion technique would require advanced knowledge of the topology of the reticle or active feedback of position or flatness at the area of interest. This could be accomplished by many techniques including use of the apparatus depicted in FIG. 1.

Another way to compensate by design for sag in a reticle suspended in a vacuum chuck frame would be to lap a spherical or otherwise curved surface into the surface of the vacuum chuck such that when the reticle is attached to the reticle chuck the induced bow in the reticle due to the curved surface of the reticle chuck perfectly compensates for the sag due to gravity.

Figure 5A:
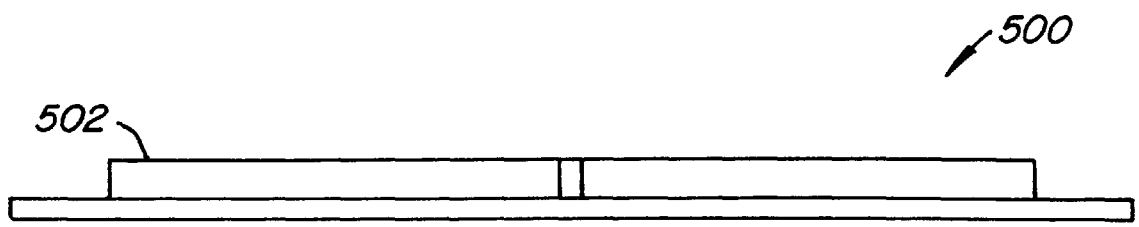
FIGS. 5A and 5B show two views of a reticle which includes a reticle stiffener.
Figure 5B:
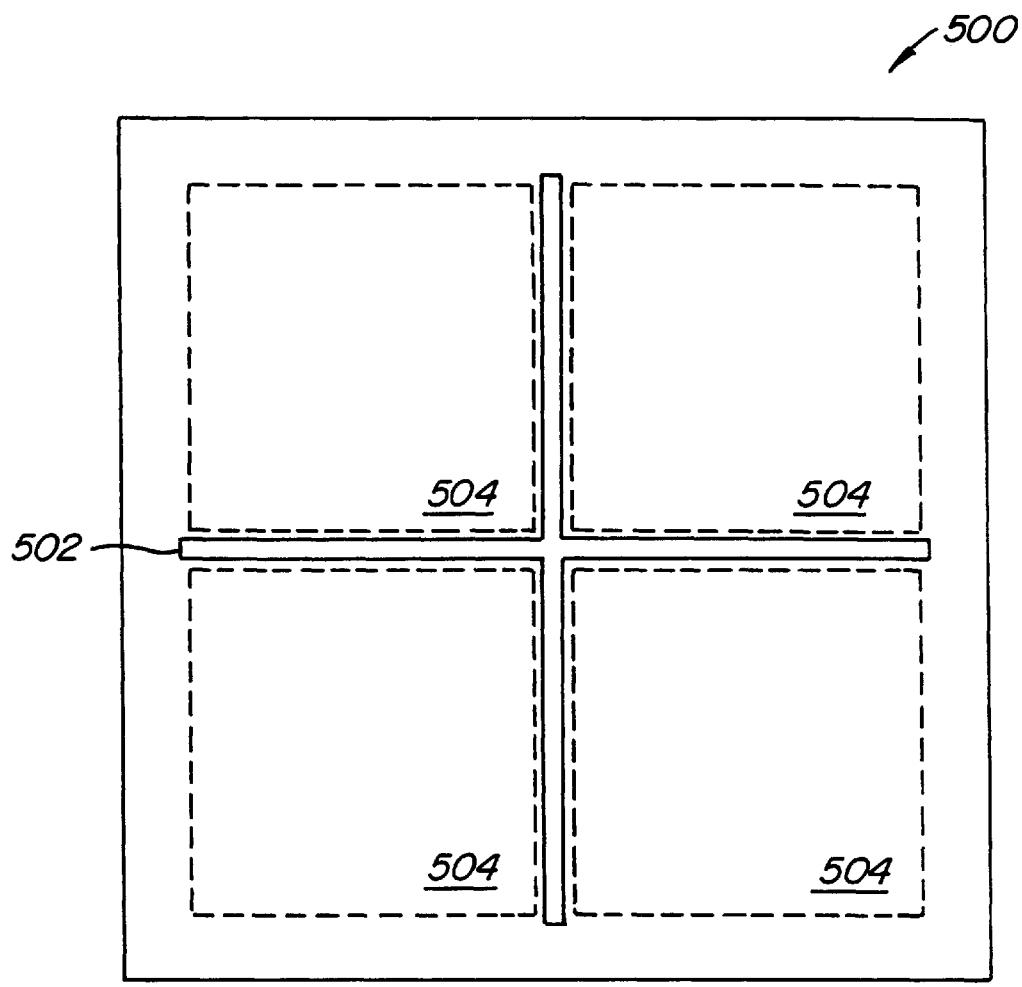

FIGS. 5A and 5B are two views of a reticle 500 designed according to a specific embodiment of the invention. Reticle 500 includes a reticle stiffener 502. As shown in FIG. 5B, reticle stiffener 502 is only secured to areas of reticle 500 which are not image areas 504, i.e., non-imaging spaces between product images. In many cases, multiple image fields are provided on a single reticle with space between the various field. Thus, the geometry of reticle stiffener 502 is determined by the locations of these spaces. A particular arrangement of image field might result in a number of separate stiffeners on the same reticle. Reticle stiffener 502 is rigidly adhered to reticle 500 and is as large as possible to maximize its stiffness. Reticle stiffener 502 is also manufactured from a highly rigid material. According to specific embodiments, reticle stiffener 502 has the same temperature coefficient of thermal expansion as reticle 500 to prevent heat induced warpage. This may be accomplished by fabricating the reticle stiffener from material used to make reticles, such as borosilicate glass or fused silica. Alternatively, a carefully chosen steel may be employed. A less invasive alternative is to build reticle stiffeners directly into the reticle chuck. According to specific ones of such embodiments, the reticle stiffeners include vacuum attachment means.

Figure 6A:
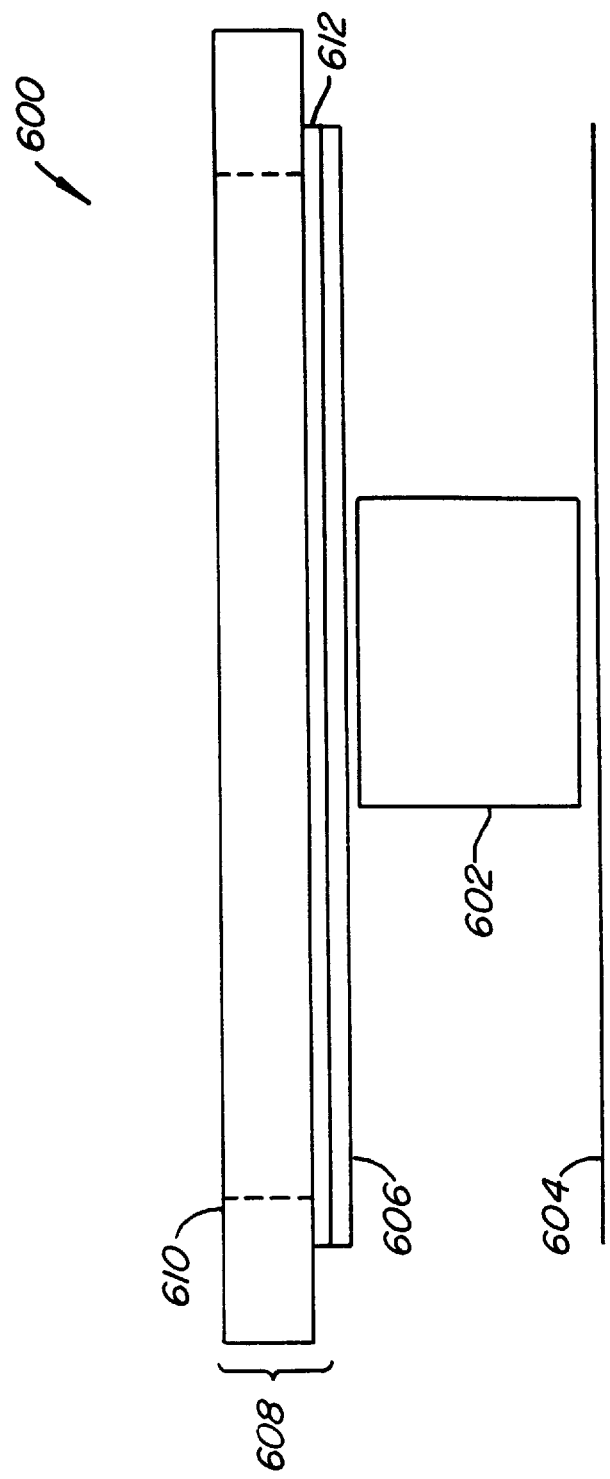
FIGS. 6A and 6B are side view block diagrams of two different embodiments of a photolithography system showing the relationship between the lens, substrate, reticle, and a reticle chuck assembly that includes a transparent reticle chuck.
Figure 6B:
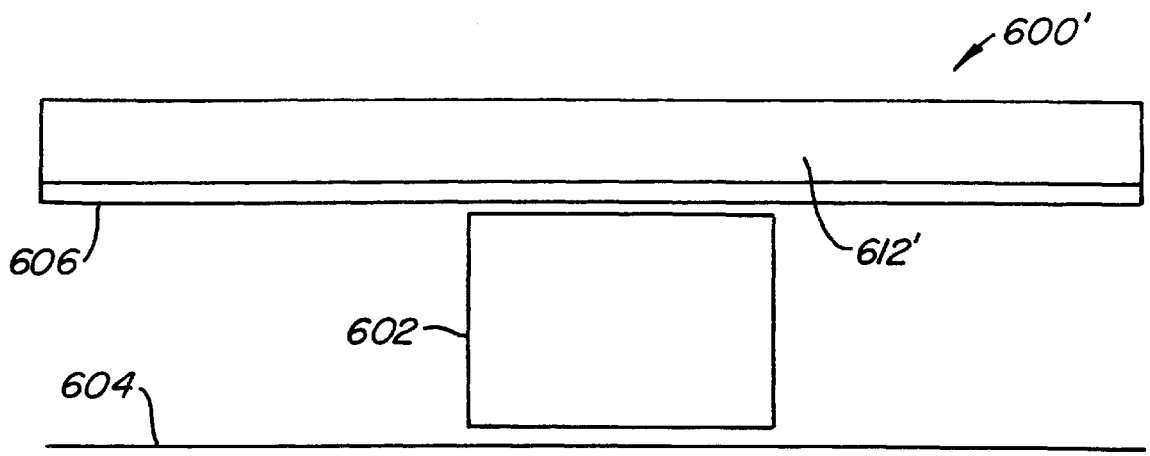

FIG. 6A is a side view of a photolithography system 600 which shows the relationship between lens 602, substrate 604, reticle 606, and a reticle chuck assembly 608 which includes a reticle chuck frame 610 and transparent reticle chuck 612. Reticle 606 is adhered to transparent reticle chuck 612 by vacuum or electrostatics. Transparent reticle chuck 612 is adhered to a reticle chuck frame 610 by vacuum or other means. This technique allows for reticle 606 to be relatively thin because of the structural support supplied by the relatively thick and stiff transparent reticle chuck 612. It will be understood that if reticle chuck 612 is made thick enough, reticle chuck frame 610 would not be required. Such an embodiment 600' is shown in FIG. 6B. Moreover, transparent reticle chucks 612 and 612' may be further augmented using the techniques described with reference to FIGS. 1–5.

Figure 7:
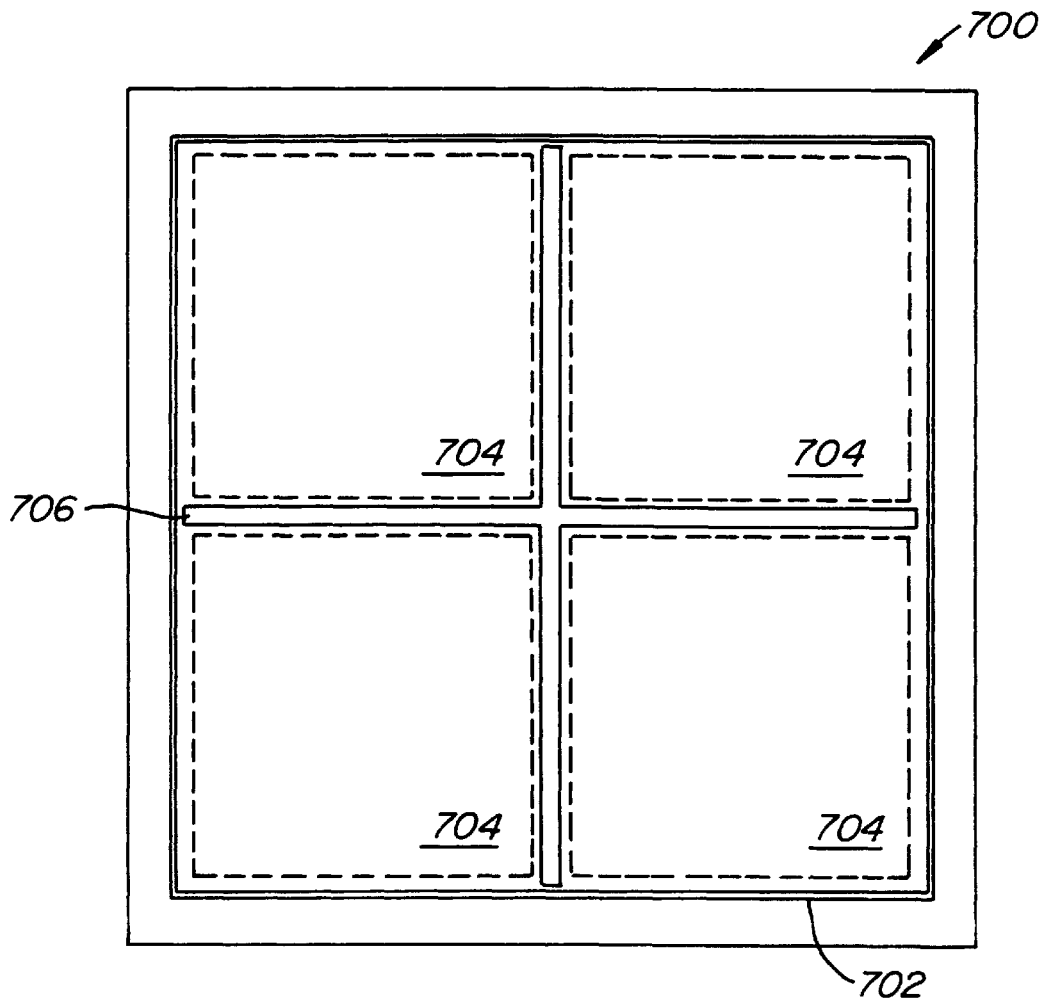
FIG. 7 is a front view of a transparent reticle chuck which includes an O-ring and a stiffener.

According to one embodiment, if electrostatics are used to adhere the reticle to the transparent reticle chuck, the transparent reticle chuck includes a pattern of transparent and oppositely charged areas on the surface that faces the reticle. The transparent charged areas may be created using a thin patterned layer of indium tin oxide, or, alternatively, thin metal traces may be employed. The conductive areas and/or traces are routed to electrodes for external electrical connection. If, according to another embodiment, vacuum is used to adhere the reticle to the transparent reticle chuck, the transparent reticle chuck includes means to induce a vacuum between the two surfaces. For example, as shown in FIG. 7, transparent reticle chuck 700 may include an O-ring seal 702 around the perimeter of image fields 704 to enclose a substantially air-tight volume. The vacuum supply may be introduced by bypassing the O-ring, or, if a stiffener 706 is included in transparent reticle chuck 700, vacuum supply may be introduced through apertures and plenums in stiffener 706 or in reticle chuck 700.

Figure 8:
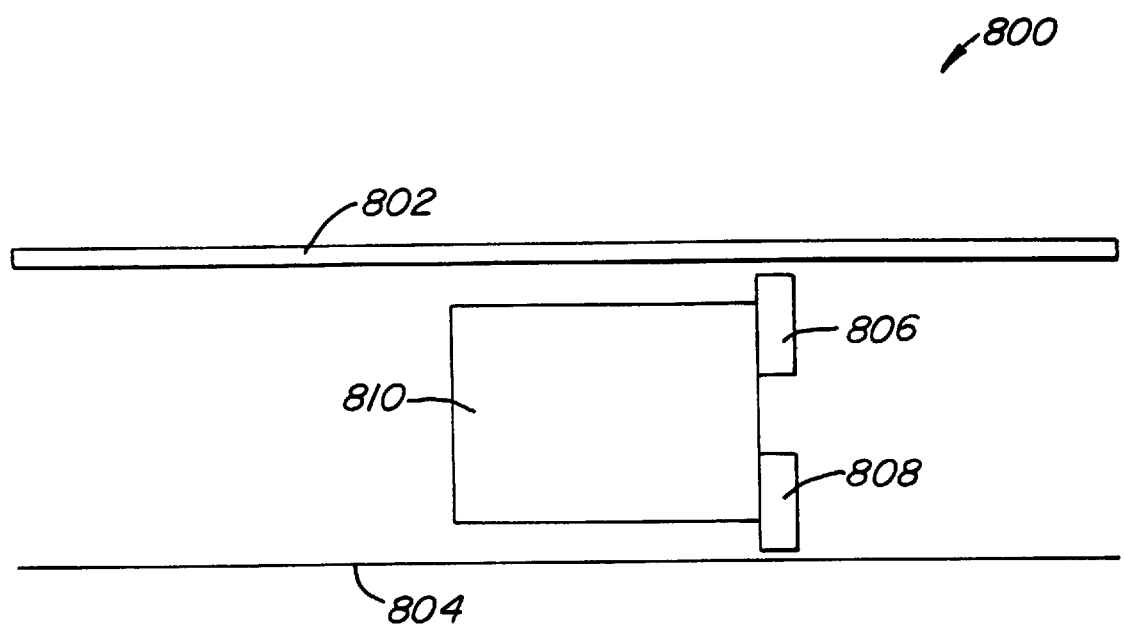
FIG. 8 is a side view block diagram of a photolithography system according to a specific embodiment of the invention.

According to another specific embodiment shown in FIG. 8, in a projection photolithography tool 800 the reticle 802 and substrate 804 are maintained substantially parallel by a pair of air bearings 806 and 808 coupled to lens system 810. One air bearing 806 is directed toward reticle 802 and another 808 is directed toward substrate 804. In embodiments having double telecentric lens systems the two air bearing do not need to be directly referenced to the lens system because the distance between the image plane (i.e., reticle) and object plane (i.e., substrate) is the critical distance, not the distance between the lens system and either of the image or object planes. Therefore, where the lens system is double telecentric, the air bearings merely need to be directed normal to their corresponding plane and in reasonably close proximity to the lens system. In embodiments having lens systems which are not double telecentric, the distances between the lens system and the image and object planes are critical and therefore the air bearings must be directly referenced to the lens system.

Depending upon the relative masses and sizes of the reticle, lens system and substrate, one of these elements may be held fixed and the positions of the others determined by the air bearings. According to various embodiments of the invention, the use of air bearings in this manner can replace or augment a separate focus detection system while simultaneously improving both focus and leveling accuracy and speed. It is important that the air bearings are stiff and that their air gaps are well regulated. Careful regulation of the air gaps allows precise control of the focus separation distance. According to more specific embodiments, a means to support and capture the air bearings is provided for situations in which the reticle and/or substrate is not in place.

Figure 9:
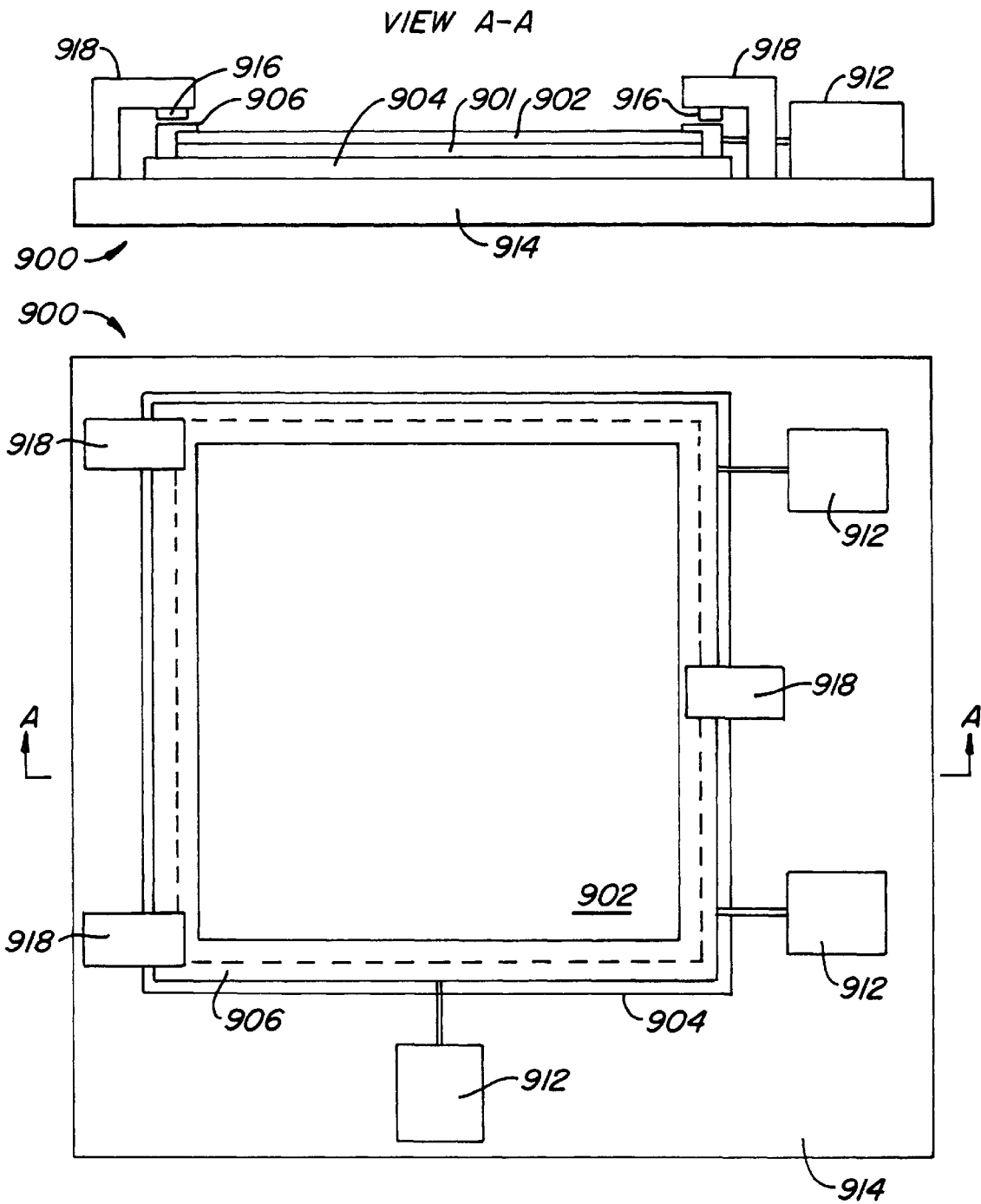
FIG. 9 is a top view and a side sectional view A—A of a photolithography system according to another specific embodiment of the invention.

According to yet another specific embodiment shown in FIG. 9, in a proximity photolithography tool 900 the gap 901 between reticle 902 and substrate 904 is established and controlled by the use of air bearing/reticle chuck 906. According to the embodiment shown, where the image area of reticle 902 is smaller than substrate 904, an air bearing is incorporated into the reticle chuck and oriented such that air bearing/reticle chuck 906 flies over the surface of substrate 904. To ensure correct flying stability, air bearing 906 is preloaded toward substrate 904. This may be accomplished, for example, by pushing the reticle chuck toward the substrate with spring mechanisms (not shown), or by attracting the reticle and reticle chuck toward the substrate with vacuum mechanisms concentrically disposed about the air bearing (also not shown).

Additionally, because the air pressure to air bearing 906 is precisely regulated, it may be used to effect small changes in gap 901 between reticle 902 and substrate 904. According to one embodiment, the lateral positions of air bearing 906 along the surface of substrate 904 is controlled by alignment actuators 912 attached to substrate chuck 914. Electromagnets 916 (shown in view A—A) affixed to small vertical motion mechanisms 918 are provided to capture and separate air bearing 906 and reticle 902 from substrate 904.

During the period when the air bearing is allowed to fly over the substrate, gas is deposited in the gap between the reticle and the substrate. If the gap is not properly ventilated, catastrophic damage to the reticle may occur. Therefore, the pressure in the gap is controlled not only to prevent such reticle damage, but also to compensate for gravity induced sags and other distortions of the reticle.

The above descriptions are illustrative and not restrictive. Many variations of the invention will become apparent to those skilled in the art upon review of this disclosure. Merely by way of example, the reticle and substrate gauging technique could be used with any style of lens. Many different types of gauges could be used, including optical or capacitive. The focus adjustment technique using the primary mirror could be done with most types of catadioptic lens types. A variety of materials of construction could be used for the various components if chosen carefully. The invention can be mounted in various orientations, and with a variety of physical mounting techniques. The apparatus may incorporate various sensors to facilitate operation or safety. Different operating sequences may also be used to tailor the operation of the invention to a particular application. This invention may also be incorporated into many different types of equipment. The scope of the invention should therefore be determined not just with reference to the above description, but instead should be determined with reference to the appended claims along with their full scope of equivalents.

What is claimed is:

1. An apparatus for detecting and compensating for focus errors in a photolithography tool, wherein the photolithography tool comprises a lens system and holds a reticle and a substrate substantially parallel, the apparatus comprising:

a first proximity gauge rigidly attached to the lens system for determining a first distance between the reticle and the lens system;

a second proximity gauge rigidly attached to the lens system for determining a second distance between the substrate and the lens system, the first and second distances being used to determine whether a focus error condition exists; and means for compensating for the focus error condition, wherein a position of the reticle is adjusted with respect to the substrate to thereby compensate for the focus error condition.

2. An apparatus for detecting and compensating for focus errors in a photolithography tool, wherein the photolithography tool holds a reticle and a substrate substantially parallel, the apparatus comprising:

a single proximity gauge for determining a distance between the reticle and the substrate, thereby determining if a focus error condition exists; and an actuator for adjusting the position of the reticle with respect to the substrate to thereby compensate for the focus error condition.

3. The apparatus of claim 2 wherein the actuator comprises at least one air bearing mechanism for exerting force on the reticle in a direction away from the substrate.

4. The apparatus of claim 3 wherein the photolithography tool comprises a lens system disposed between the reticle and substrate, the at least one air bearing mechanism being mounted on the lens system.

5. The apparatus of claim 2 wherein the actuator comprises an air pressure mechanism for exerting force on the reticle both toward and away from the substrate.

6. The apparatus of claim 5 wherein the photolithography tool comprises a reticle chuck having an aperture, the aperture forming a sealed chamber when the reticle is adhered to the reticle chuck, the air pressure mechanism exerting force on the reticle.

7. The apparatus of claim 2 wherein the photolithography tool comprises a lens system disposed between the reticle and substrate, the single proximity gauge being mounted on the lens system.

8. A method for detecting and compensating for focus errors in a photolithography tool, wherein the photolithography tool holds a reticle and a substrate substantially parallel, the method comprising the steps of:

determining a distance between the reticle and the substrate using a single proximity gauge, thereby determining if a focus error condition exists; and adjusting the position of the reticle with respect to the substrate thereby compensating for the focus error condition.

9. The method of claim 8 wherein the adjusting step comprises exerting force on the reticle in a direction away from the substrate.

10. The method of claim 9 wherein the exerting step is achieved by means of an air bearing mechanism.

11. The method of claim 8 wherein the adjusting step comprises exerting force on the reticle both toward and away from the substrate.

12. The method of claim 11 wherein the exerting step is achieved by means of an air pressure mechanism.

13. An apparatus for detecting and compensating for focus errors in a photolithography tool, wherein the photolithography tool holds a reticle and a substrate substantially parallel and comprises a lens system disposed between the reticle and substrate, the apparatus comprising:

at least one proximity gauge for determining a first distance between the reticle and the substrate, thereby determining if a focus error condition exists; and a lens system actuator for adjusting a lens system parameter to thereby compensate for the focus error condition.

14. The apparatus of claim 13 wherein the lens system comprises a primary mirror and a plurality of lens elements, the lens system parameter comprises an axial position of the primary mirror, and the lens system actuator comprises a primary mirror actuator for adjusting the axial position of the primary mirror with respect to the lens elements.

15. The apparatus of claim 13 wherein the lens system actuator is operable to move at least a portion of the lens system in a direction axial to a remaining part of the lens system.

16. The apparatus of claim 13 wherein the at least one proximity gauge is mounted on the lens system.

17. The apparatus of claim 16 wherein the at least one proximity gauge comprises first and second proximity gauges, the first proximity gauge for determining a second distance between the reticle and the lens system, and the second proximity gauge for determining a third distance between the substrate and the lens system, the first distance being determined from the second and third distances.

18. A method for detecting and compensating for focus errors in a photolithography tool, wherein the photolithography tool holds a reticle and a substrate substantially parallel and comprises a lens system disposed between the reticle and substrate, the lens system comprising a primary mirror having an axial position and a plurality of lens elements, the method comprising the steps of:

determining a first distance between the reticle and the substrate, thereby determining if a focus error condition exists; and adjusting the axial position of the primary mirror with respect to the lens elements thereby compensating for the focus error condition.

19. A method for detecting and compensating for focus errors in a photolithography tool, wherein the photolithography tool holds a reticle and a substrate substantially parallel and comprises a lens system disposed between the reticle and substrate, the method comprising the steps of:

determining a first distance between the reticle and the substrate, thereby determining if a focus error condition exists; and moving a portion of the lens system in a direction axial to a remaining portion of the lens system thereby compensating for the focus error condition.

20. A lens system for use in a photolithography system, comprising:

a primary mirror having an axial position;

a plurality of lens elements including at least one prism; and a primary mirror actuator for adjusting the axial position of the primary mirror with respect to the plurality of lens elements, thereby moving the image plane.

21. A reticle for use in a photolithography system, comprising:

a plurality of image fields distributed over a surface of the reticle;

non-imaging area between the plurality of image fields; and at least one stiffener secured to the surface of the reticle in a portion of the non-imaging area for reducing warpage of the reticle.

22. The reticle of claim 21 wherein the at least one stiffener and the reticle have a single temperature coefficient of thermal expansion.

23. An apparatus for maintaining a reticle and a substrate substantially parallel in a photolithography system, comprising at least one air bearing oriented toward at least one of the reticle and substrate for exerting force thereon, wherein a position of the reticle is adjusted with respect to the substrate to thereby compensate for the focus error condition.

24. The apparatus of claim 23 wherein the at least one air bearing comprises a first air bearing oriented toward the reticle and a second air bearing oriented toward the substrate.

25. The apparatus of claim 23 wherein the at least one air bearing is incorporated into a reticle chuck on which the reticle is disposed, the at least one air bearing being oriented toward the substrate.

26. The apparatus of claim 23 wherein the substrate is secured to a substrate chuck, the apparatus further comprising an alignment actuator coupled to the substrate chuck for moving the at least one air bearing across the surface of the substrate.

27. The apparatus of claim 23 further comprising at least one electromagnet for capturing and securing the at least one air bearing.

28. A method for maintaining a reticle and a substrate substantially parallel in a photolithography system, comprising the step of exerting force on at least one of the reticle and substrate using at least one air bearing, wherein a position of the reticle is adjusted with respect to the substrate to thereby compensate for the focus error condition.

29. The method of claim 28 wherein the exerting step comprises the steps of:

exerting force on the reticle with a first air bearing; and exerting force on the substrate with a second air bearing.

30. The method of claim 28 wherein the reticle and the substrate are characterized by a focus position corresponding to a distance between a point on the reticle and a corresponding point on the substrate, the method further comprising the step of controlling the at least one air bearing so as to adjust the focus position.

31. An apparatus for detecting and compensating for focus errors in a photolithography tool having a lens system, the apparatus comprising:

a first proximity gauge for determining a first distance between a reticle and the lens system;

a second proximity gauge for determining a second distance between a substrate and the lens system, the first and second distances being used to determine whether a focus error condition exists; and an actuator for adjusting the position of the reticle with respect to the substrate to thereby compensate for the focus error condition.

32. The apparatus of claim 31 wherein the actuator comprises at least one air bearing mechanism for exerting force on the reticle in a direction away from the substrate.

33. The apparatus of claim 32 wherein the at least one air bearing mechanism is mounted on the lens system.

34. The apparatus of claim 31 wherein the actuator comprises an air pressure mechanism for exerting force on the reticle both toward and away from the substrate.

35. The apparatus of claim 34 wherein the photolithography tool comprises a reticle chuck having an aperture, the aperture forming a sealed chamber when the reticle is adhered to the reticle chuck, the air pressure mechanism exerting force on the reticle.

36. The apparatus of claim 31 wherein the at least one proximity gauge is mounted on the lens system.

37. The apparatus of claim 1 wherein the lens system is selected from a group comprising a unity magnification, telecentric, and catadioptric lens system.

38. The apparatus of claim 1 wherein the lens system is a Wynn-Dyson lens system.

39. The apparatus of claim 13 wherein the lens system is selected from a group comprising a unity magnification, telecentric, and catadioptric lens system.

40. The apparatus of claim 13 wherein the lens system is a Wynn-Dyson lens system.

* * * * *